US009179571B2

(12) United States Patent
Rossman et al.

(10) Patent No.: US 9,179,571 B2
(45) Date of Patent: Nov. 3, 2015

(54) CABLE BACKPLANE SYSTEM HAVING LOCKING ASSEMBLIES

(71) Applicant: Tyco Electronics Corporation, Berwyn, PA (US)

(72) Inventors: Jared Evan Rossman, Dover, PA (US); Christopher David Ritter, Hummelstown, PA (US); David Stanley Szczesny, Hershey, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 118 days.

(21) Appl. No.: 13/950,994

(22) Filed: Jul. 25, 2013

(65) Prior Publication Data

US 2015/0029675 A1 Jan. 29, 2015

(51) Int. Cl.
*H05K 7/02* (2006.01)
*H05K 7/14* (2006.01)
*H05K 7/18* (2006.01)

(52) U.S. Cl.
CPC ............... *H05K 7/1447* (2013.01); *H05K 7/18* (2013.01)

(58) Field of Classification Search
CPC ........... H01R 13/6461; H01R 13/6587; H01R 12/714; H01R 12/73; H01R 13/516; H01R 12/724; H01R 13/6473; H01R 13/514; H01R 13/6583; H01R 24/28; H01R 24/60; H01R 43/20; H01R 43/26; H01R 9/032; H01R 13/508; H01R 13/512; H01R 13/56; H01R 13/565; H01R 13/6215; H01R 13/6271; H01R 13/6275; H01R 13/6315; H01R 13/65802; H01R 13/73; H01R 9/2416; H01R 12/57; H01R 12/716; H01R 12/737; H01R 12/91; H01R 13/03; H01R 13/26; H01R 13/6453; H01R 13/6471; H01R 43/16; H01R 43/205; H01R 4/023; G06F 1/187; G06F 1/18; G06F 1/189; G06F 1/26; G06F 1/184; G06F 1/181; G06F 1/185; G06F 1/16; G06F 1/20; G06F 11/2025; G06F 11/203; G06F 11/2041; G06F 15/161; G06F 1/183; G06F 2200/1639; G06F 2213/003; H05K 7/1492; H05K 7/1448; H05K 7/1425; H05K 7/20736; H05K 7/1401; H05K 7/1402; H05K 7/142; H05K 7/1429; H05K 7/1447; H05K 7/1461; H05K 7/1488; H05K 7/20727; H05K 1/11; H05K 1/18; H05K 7/1411; H05K 7/186; H05K 7/2079; H05K 7/20745; H05K 7/20818; H05K 9/0018
USPC ............. 361/679.01, 679.02, 679.55–679.58, 361/724–727, 752, 785, 786, 787, 788, 789, 361/827, 826, 825; 312/223.1–223.2; 211/26; 174/79
See application file for complete search history.

(56) References Cited

U.S. PATENT DOCUMENTS

| | | | | |
|---|---|---|---|---|
| 7,318,532 B1 * | 1/2008 | Lee et al. | ........................ | 211/26 |
| 2009/0245745 A1 * | 10/2009 | Krampotich et al. | ......... | 385/135 |
| 2014/0360753 A1 * | 12/2014 | Sechrist et al. | ................. | 174/79 |

*Primary Examiner* — Anthony Haughton
*Assistant Examiner* — Ingrid Wright (57) ABSTRACT

A cable backplane system includes a backplane having a plurality of openings and mounting blocks proximate the openings. A cable rack is coupled to a rear of the backplane that includes a tray, spacers coupled to the tray and cable connector assemblies held by corresponding spacers. Each cable connector assembly has a plurality of cables extending between cable connectors. The cable connectors are received in corresponding openings and held in position relative to the backplane by the spacers. Locking assemblies are held by the tray and have a latch proximate to a front edge of the tray configured to interact with a corresponding one of the mounting blocks to lockably couple the tray to the backplane. The locking assemblies each have an actuator at a rear of the tray that is actuated by an installer to lock and unlock the latch with the mounting block.

20 Claims, 9 Drawing Sheets

CABLE BACKPLANE SYSTEM HAVING LOCKING ASSEMBLIES

BACKGROUND OF THE INVENTION

The subject matter herein relates generally to cable backplane systems having locking assemblies.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. For high density cable backplane systems, space is limited and the cable trays need to be stacked directly adjacent one another. Access to components of the cable tray, such as spacers and mounting blocks that are used to mount the cable trays to the backplane, may be difficult or even impossible, particularly in designs where each spacer of the cable tray must be independently positioned and coupled to a corresponding mounting block.

A need remains for a cable backplane system that may be assembled in a cost effective and reliable manner.

BRIEF DESCRIPTION OF THE INVENTION

In one embodiment, a cable backplane system is provided that includes a backplane having a plurality of openings therethrough. The backplane has mounting blocks proximate the openings. A cable rack is coupled to a rear of the backplane. The cable rack includes a tray having a frame with side walls surrounding a raceway, spacers coupled to the tray and cable connector assemblies held by corresponding spacers. Each cable connector assembly has a plurality of cables extending between at least two cable connectors. The cables are routed in the raceway. The cable connectors are received in corresponding openings and held in position relative to the backplane by the spacers. Locking assemblies are held by the tray. The locking assemblies each having a latch proximate to a front edge of the tray configured to interact with a corresponding one of the mounting blocks to lockably couple the tray to the backplane. The locking assemblies each have an actuator at a rear of the tray that is actuated by an installer to lock and unlock the latch with the mounting block.

Optionally, the latch may be rotated between locked and unlocked positions. The latch may pass at least partially through a corresponding one of the spacers. The latch may include a groove. The mounting block may include a peg received in the corresponding groove.

Optionally, the latch may include a guide pin extending forward of the spacer and front edge of the frame. The guide pin may pass through the backplane into the corresponding mounting block. The guide pin may be rotated to lock the guide pin in the mounting block. The guide pin may include a groove along a side of the guide pin. The mounting block may include a socket that receives the guide pin and a peg extending into the socket. The peg may be received in the groove to lock the guide pin in the mounting block.

Optionally, the latch may include a socket received in the spacer. The mounting block may include a guide pin. The guide pin may be received in the spacer and in the socket. The socket may be rotated to lock the guide pin in the socket. The socket may include a groove along a side of the socket. The guide pin may include a peg extending therefrom. The peg may be received in the groove to lock the guide pin in the socket.

Optionally, each locking assembly may include a handle accessible at the rear of the tray that is turned to actuate the actuator and lock or unlock the latch. The locking assemblies may fix the spacers in position relative to the backplane. The cable connectors may be configured to float relative to the spacers to change positions of the cable connectors relative to the backplane.

DETAILED DESCRIPTION OF THE INVENTION

Figure 1:
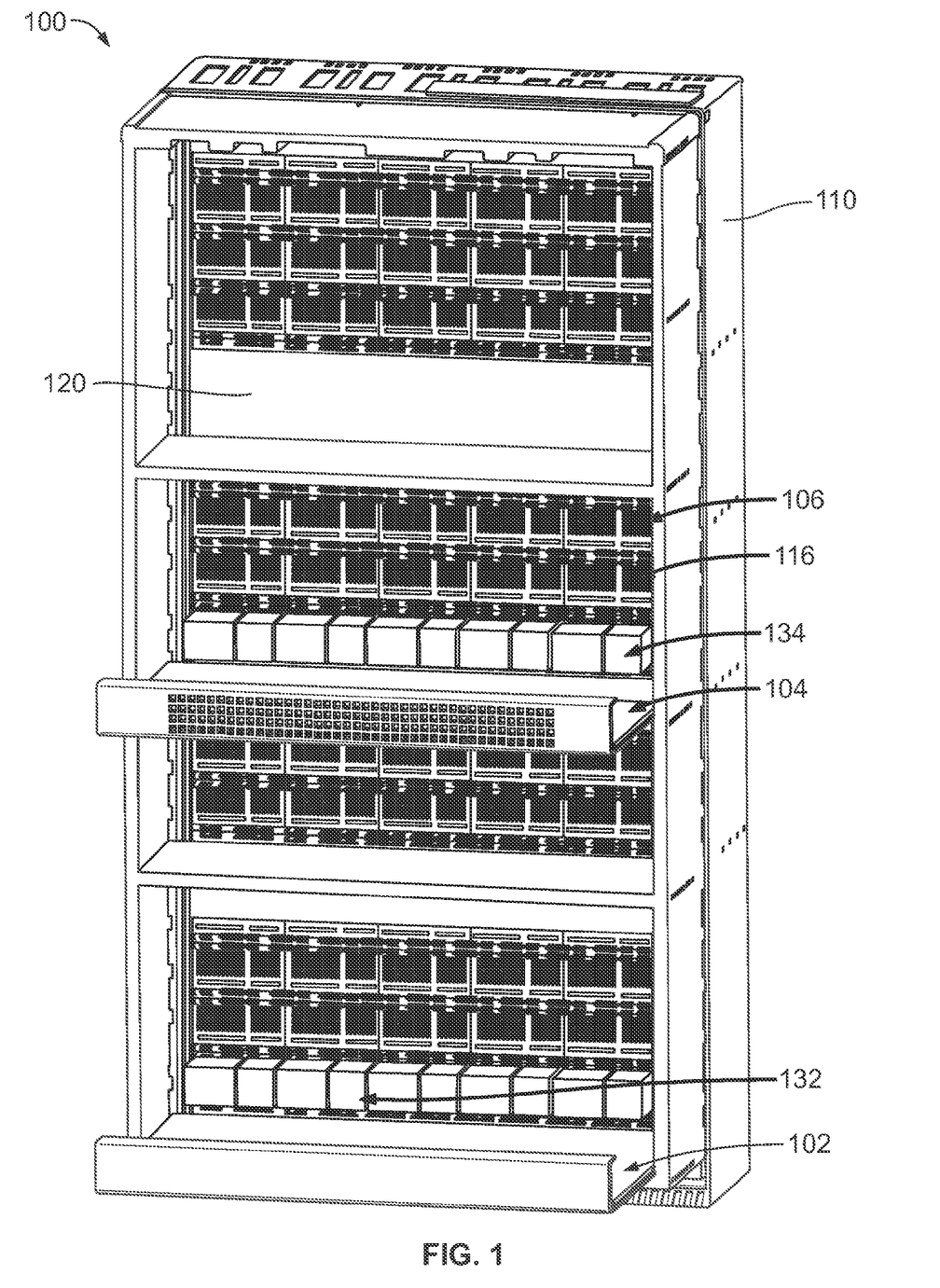
FIG. 1 is a front perspective view of a cable backplane system formed in accordance with an exemplary embodiment.
Figure 2:
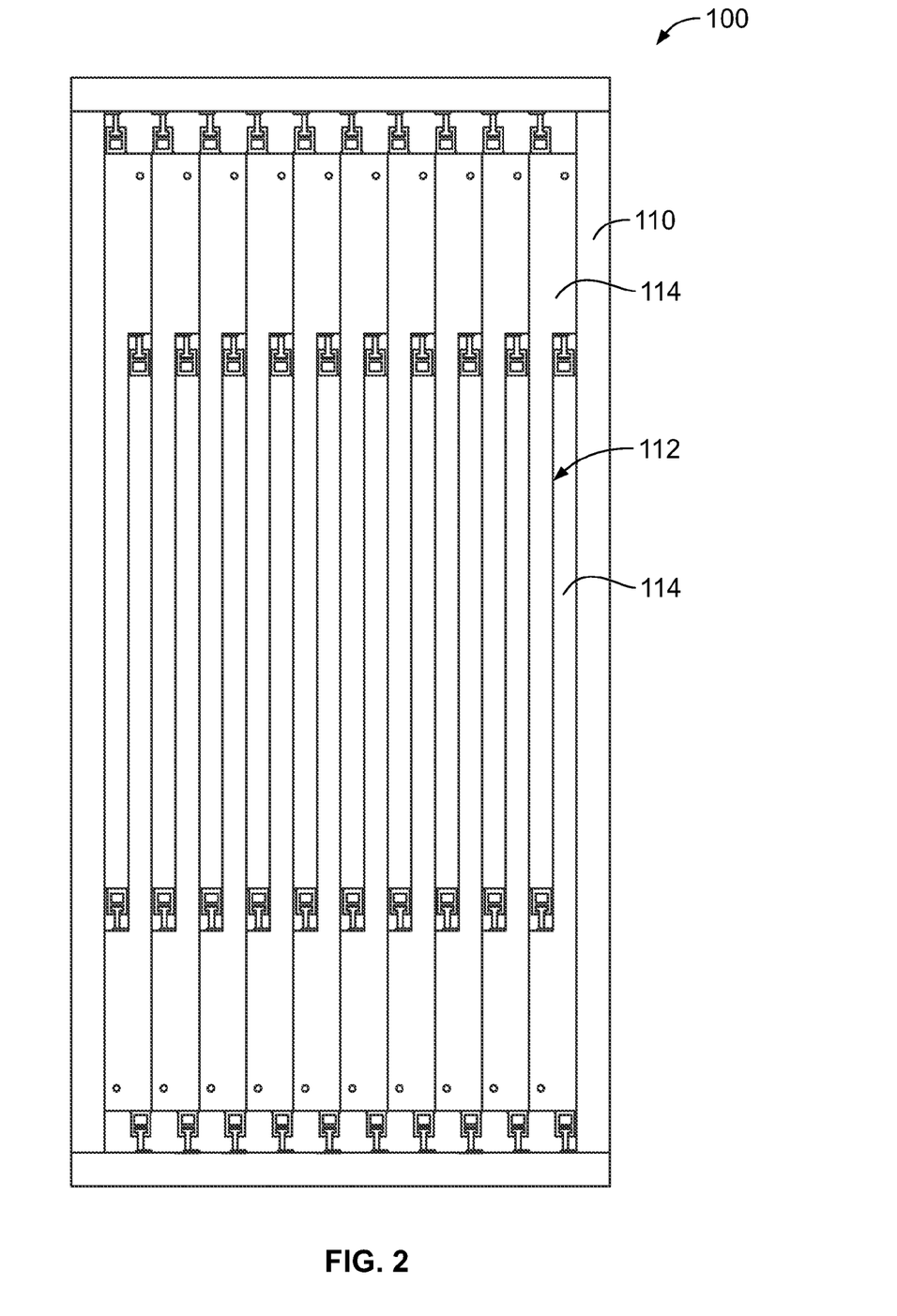
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the line cards 102 and switch cards 104 coupled to the cable backplane system 100.

The cable backplane system 100 includes a cable rack 112 (shown in FIG. 2) that supports and/or manages the cables of the cable connector assemblies 106. The cable rack 112 includes a plurality of trays 114 (shown in FIG. 2) that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 is coupled to and supported by the chassis 110. The trays 114 and cable connectors 116 are coupled to the backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces or circuits of the backplane 120. The cable connectors 116 are not electrically connected to the backplane 120, as is typical of conventional backplanes, but rather the cable connectors 116 are interconnected by cables extending between the cable connectors 116. The backplane 120 may be manufactured from other materials in alternative embodiments, such as another dielectric material or a metal material, such as a metal sheet, such as when no electrical routing on the backplane 120 is required.

Figure 3:
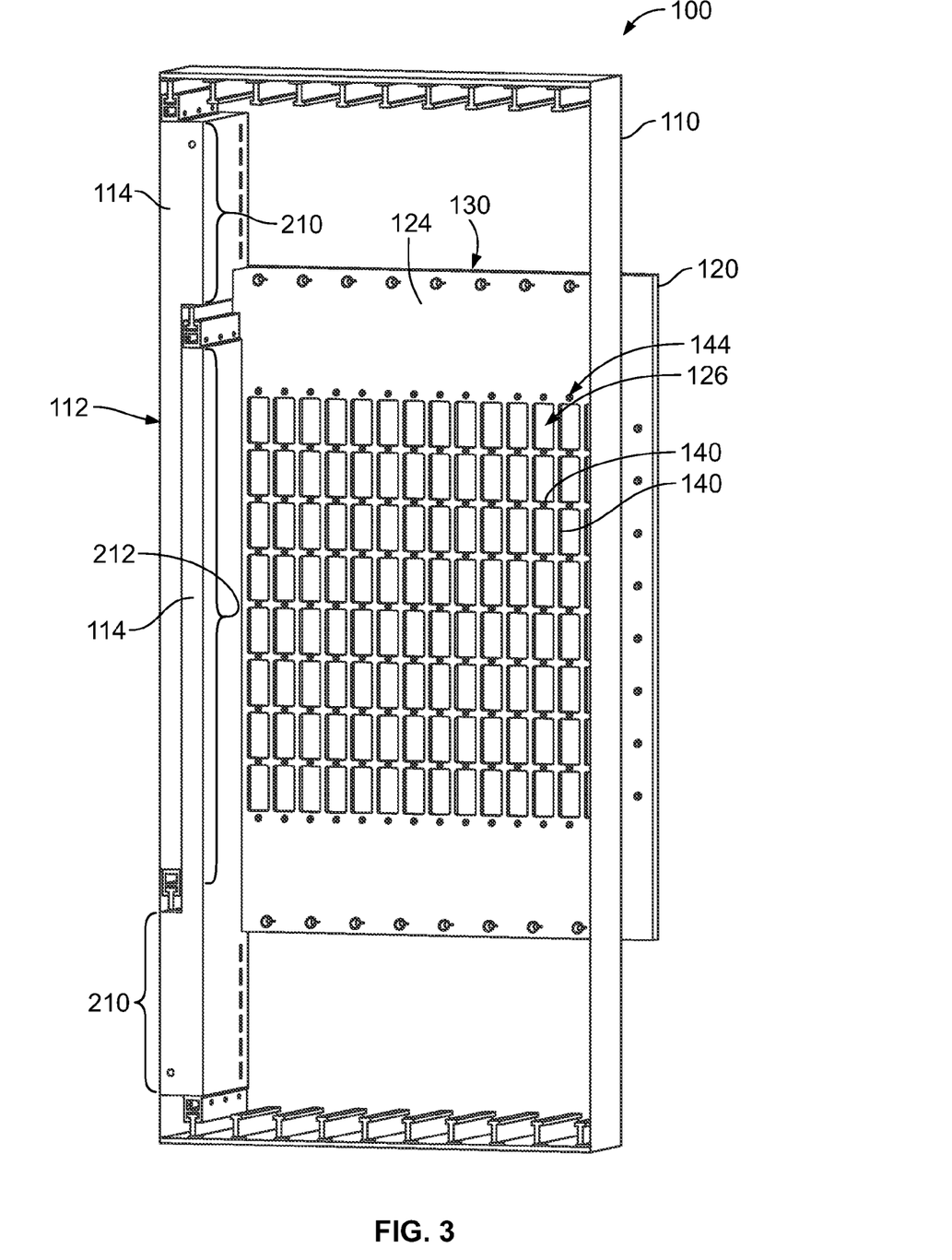
FIG. 3 illustrates a portion of the cable backplane system.

FIG. 3 illustrates the cable backplane system 100 with many of the trays 114 removed for clarity, only showing a couple of the trays 114 mounted to the chassis 110 and backplane 120. The backplane 120 and cable rack 112, with the cable connector assemblies 106 (shown in FIG. 1), are coupled together to form the cable backplane system 100. The cable rack 112 is provided along a rear 124 of the backplane 120. The cable connectors 116 (shown in FIG. 1) extend through openings 126 in the backplane 120 and are presented at a front 128 of the backplane 120 for mating with the line and switch cards 102, 104 (both shown in FIG. 1). In an exemplary embodiment, the cable connectors 116 are held in precise locations for mating with the line cards 102 and/or switch cards 104. The cable rack 112 includes features that align and position the cable connectors 116 with respect to the backplane 120 and that secure the trays 114 to the backplane 120. In an exemplary embodiment, because of the high density of the trays 114 and the limited access to the trays 114, the features used to secure the trays 114 to the backplane are accessible at a rear of the cable rack 112 where such features are more easily accessible.

In an exemplary embodiment, the cable rack 112 is flexible to allow the cable connectors 116 to align with and pass through the openings 126. Optionally, portions of the trays 114 and/or the cable connectors 116 may pass through the openings 126. The trays 114 may float relative to each other and with respect to the backplane 120 to properly align the cable connectors 116 with the corresponding openings 126. Once the trays 114 are coupled to the backplane 120, the backplane 120 may be used to hold the cable connectors 116 in precise locations for mating with the line and switch cards 102, 104. For example, the openings 126 may be used to control the final position of the cable connectors 116 for mating. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 132, 134 (both shown in FIG. 1), respectively, that mate with corresponding cable connectors 116. The cable connectors 116 need to be precisely positioned relative to the backplane 120 for mating with corresponding card connectors 132, 134.

A plurality of the openings 126 are visible in FIG. 3. Each opening is sized and shaped to receive a single cable connector 116 (shown in FIG. 1) therein; however the openings 126 may be sized to receive multiple cable connectors 116 therein in alternative embodiments.

The backplane 120 includes crossbars 140 between adjacent openings 126. The crossbars 140 provide support for the backplane 120. The crossbars 140 define mounting locations of the backplane 120 for securing the cable connector assemblies 106 and/or the cable rack 112 to the backplane 120. Optionally, the crossbars 140 may provide a mounting location for mounting blocks 142 (shown in FIG. 9), which may be metal blocks that extend across the front of the backplane 120 to stiffen the backplane 120. The trays 114 may have features that interact with the mounting blocks 142 to secure the trays 114 to the backplane 120. In an exemplary embodiment, the backplane 120 includes guide holes 144 through the crossbars 140 that are used for guidance or alignment of the cable connector assemblies 106 and/or the cable rack 112 during assembly. The guide holes 144 receive guide features, fasteners or other components used to assemble the cable backplane system 100. The guide features may be part of the trays 114 that extend through the backplane 120. The guide features may be part of the mounting blocks 142 coupled to the backplane 120.

Figure 4:
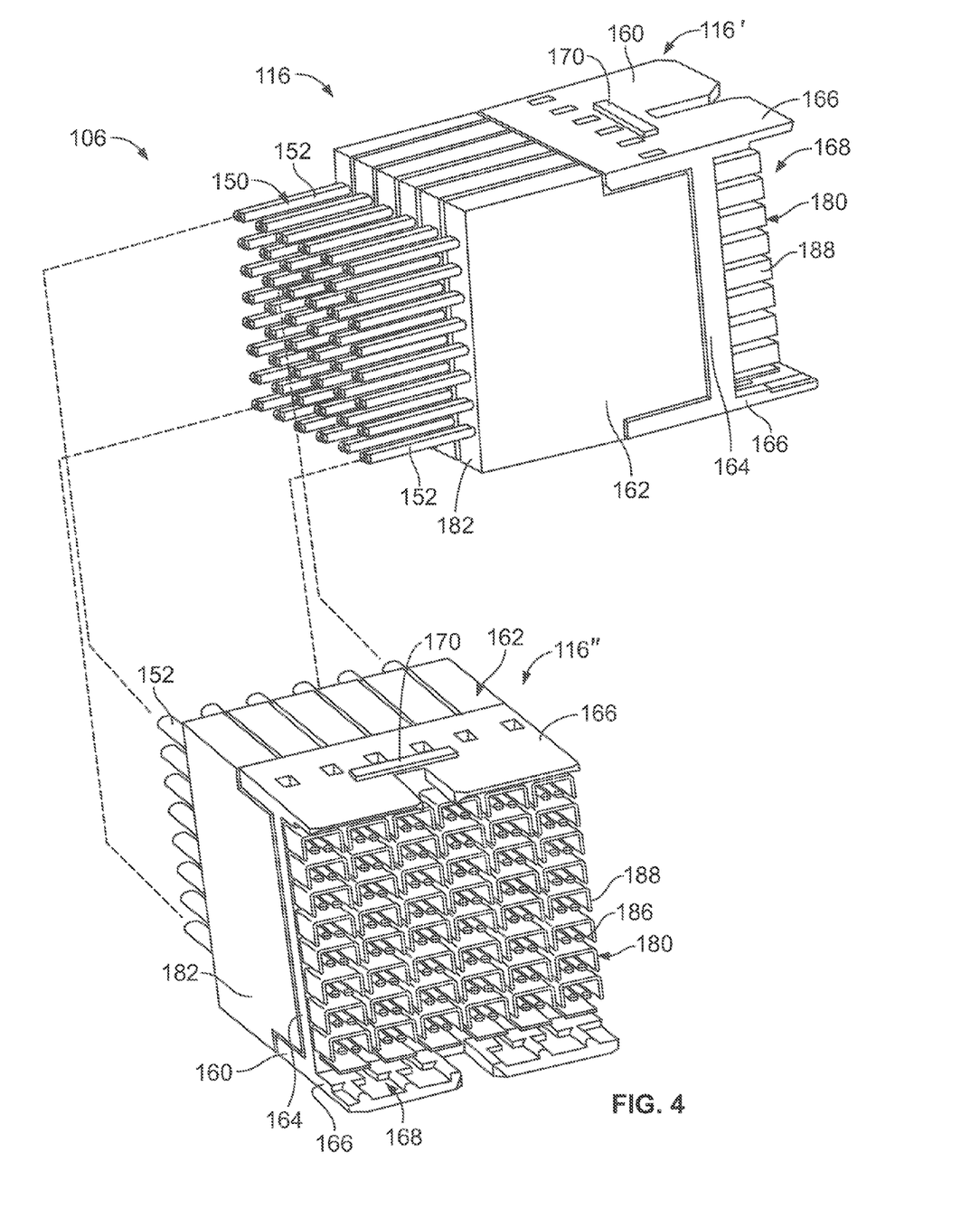
FIG. 4 illustrates a cable connector assembly for the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common each ground shield 188 and a dielectric overmold overmolded around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
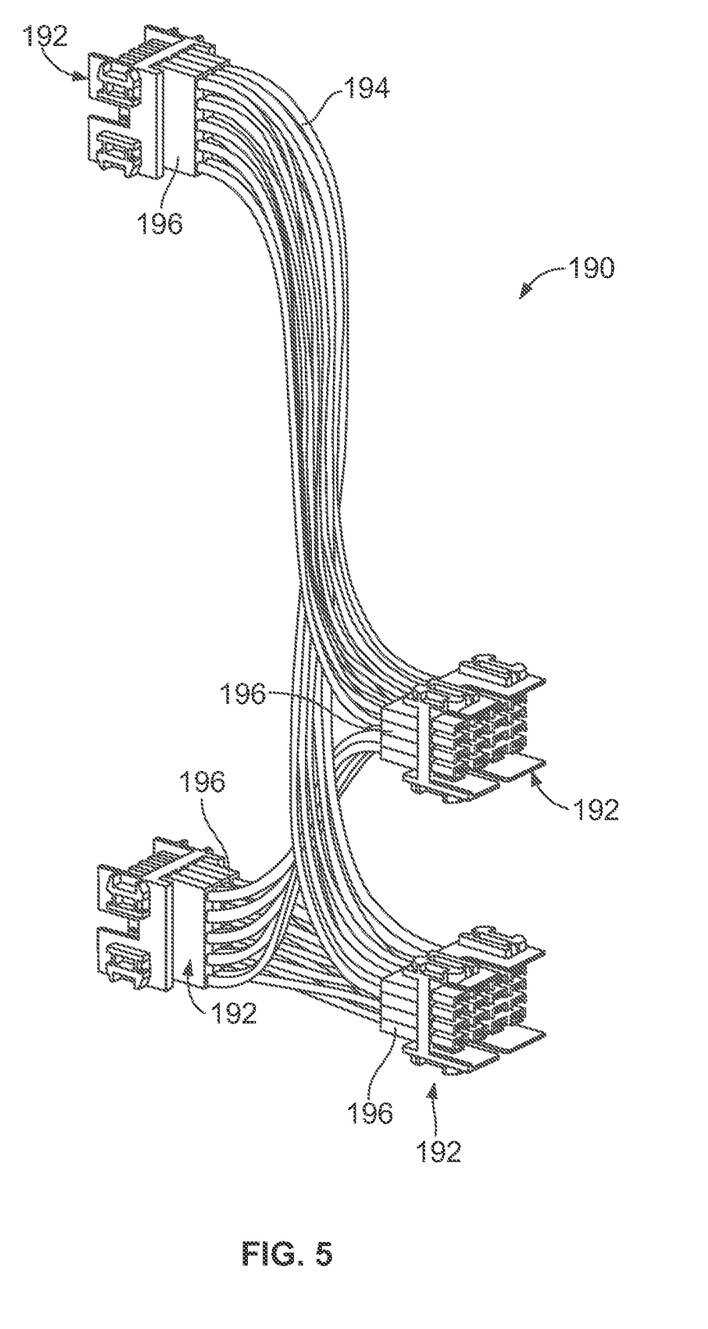
FIG. 5 illustrates a cable connector assembly for the cable backplane system and formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (for example, four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
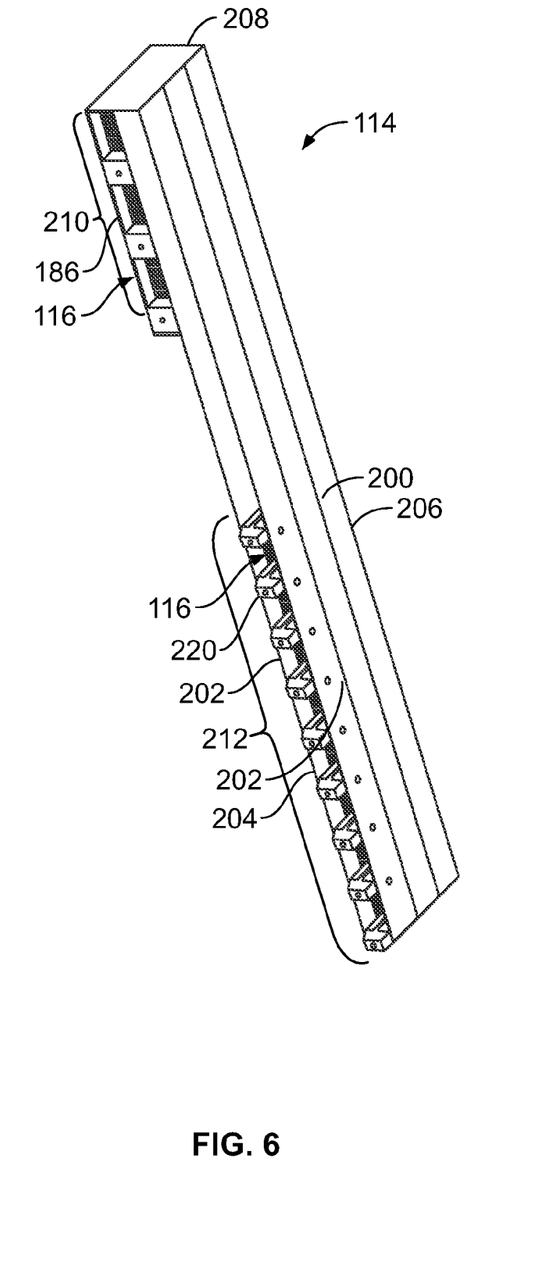
FIG. 6 is a perspective view of a tray for the cable backplane system and formed in accordance with an exemplary embodiment.
Figure 7:
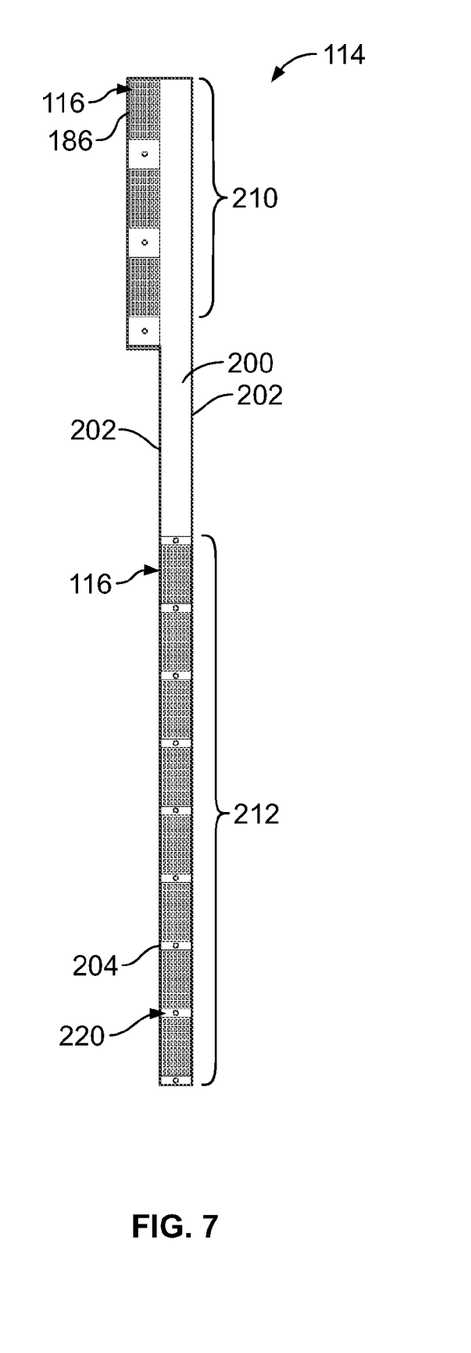
FIG. 7 is a front view of the tray.

FIG. 6 is a perspective view of one of the trays 114 formed in accordance with an exemplary embodiment. FIG. 7 is a front view of the tray 114. The tray 114 includes a frame 200 surrounding a raceway through which the cables 152 (shown in FIG. 4) are routed. The frame 200 includes side walls 202 extending between a front edge 204 and a rear 206 of the frame 200. A back wall 208 covers the raceway at the rear 206. The frame 200 is open at the front edge 204 between the side walls 202 to receive the cable connectors 116 therein.

In an exemplary embodiment, the side walls 202 and back wall 208 are one or more sheet metal pieces that are stamped, formed and may be coupled together using fasteners or other connecting means. The sheet metal may be sufficiently thin to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120.

In an exemplary embodiment, the tray 114 includes a line card section 210 and a switch card section 212. The cable connectors 116 arranged in the line card section 210 are configured for mating with the card connectors 132 associated with the line card 102 (both shown in FIG. 1) and the cable connectors 116 arranged in the switch card section 212 are configured for mating with the card connectors 134 associated with the switch card 104 (both shown in FIG. 1). The tray 114 may have different sections in alternative embodiments.

The frame 200 in the line card section 210 may be different than the frame 200 in the switch card section 212. For example, the frame 200 in the line card section 210 may be wider than the frame 200 in the switch card section 212, such as to accommodate different sized cable connectors 116. In the illustrated embodiment, the cable connectors 116 in the line card section 210 are larger than the cable connectors 116 in the switch card section 212 and have more pairs of signal contacts 186. For example, the cable connectors 116 in the line card section 210 are 16×8 connectors having sixteen pairs of signal contacts 186 in each row and eight pairs of signal contacts 186 in each column, whereas the cable connectors 116 in the switch card section 212 are 6×8 connectors having six pairs of signal contacts 186 in each row and eight pairs of signal contacts in each column. Other combinations are possible in alternative embodiments.

The tray 114 includes a plurality of spacers 220 used to hold positions of the cable connectors 116. The spacers 220 in the line card section 210 may be different types than the spacers 220 in the switch card section 212. For example, the spacers 220 may have different sizes, shapes and/or features, such as guide pins. The spacers 220 function to support one or more cable connectors 116 within the frame 200. The spacers 220 align and position the cable connectors 116 with respect to the backplane 120. Optionally, the spacers 220 may be coupled to the side walls 202 using float mechanisms, such as fasteners, that allow the spacers 220 to move or float relative to the frame 200. The spacers 220 may be allowed to float in mutually perpendicular X, Y and/or Z directions. In an exemplary embodiment, the spacers 220 are configured to abut against the backplane 120 at the mounting locations of the backplane to precisely position the cable connectors 116 relative to the openings 126.

The tray 114 includes a plurality of locking assemblies 230 (shown in FIG. 8) that are used to secure the tray 114 to the backplane 120. The locking assemblies 230 are configured to engage and interact with the mounting blocks 142 held by the backplane 120. When the locking assemblies are engaged with the mounting blocks 142 and locked in position, the tray 114 is rigidly held to the backplane 120. In an exemplary embodiment, the locking assemblies 230 are accessible at the back wall 208 of the tray 114 to allow for easy access to the locking assemblies 230, particularly when the tray 114 is part of the cable rack 112 (shown in FIG. 1) and tightly stacked with other trays 114.

With reference back to FIG. 3, when the trays 114 are arranged in the chassis 110, adjacent trays 114 are inverted such that one tray 114 is arranged with the line card section 210 along the top of the cable rack 112 and with the adjacent tray arranged with the line card section 210 along the bottom of the cable rack 112. The switch card sections 212 of the pair of trays 114 are aligned along the center section of the cable rack 112. Such an arrangement allows for tight packing of the trays 114 in the chassis 110 even though the line card section 210 and switch card section 212 have different widths. Other configurations are possible in alternative embodiments. The locking assemblies 230 of any of the trays 114 may be easily accessed from the rear of the cable rack 112 to allow for ease of insertion and removal of any particular tray 114 without needing to disassemble the entire cable rack 112.

Figure 8:
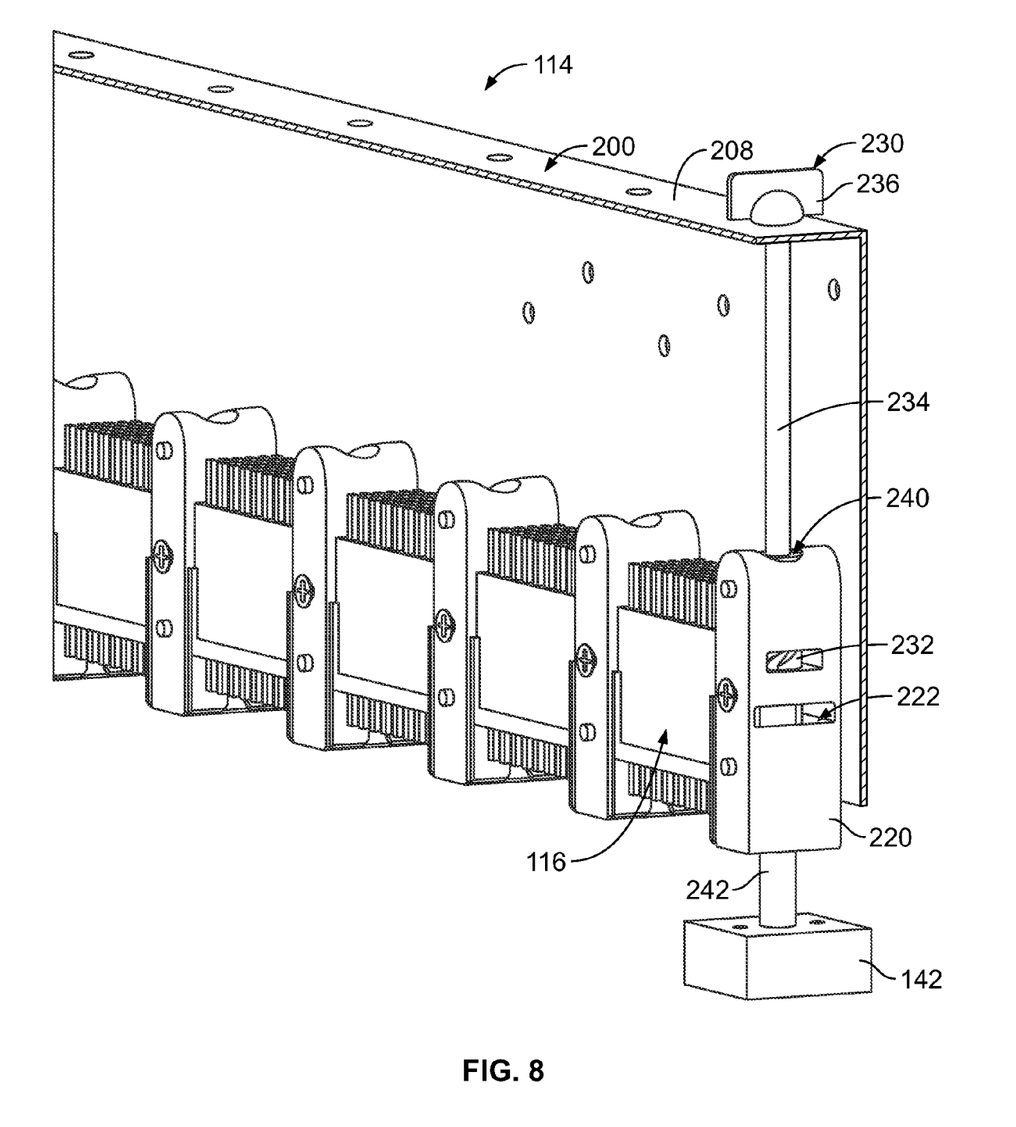
FIG. 8 is a partial sectional view of the tray showing a locking assembly formed in accordance with an exemplary embodiment.

FIG. 8 is a partial sectional view of the tray 114 with a portion of the frame 200 removed to illustrate one of the locking assemblies 230, the spacers 220 and the cable connectors 116. Each spacer 220 may have a corresponding locking assembly 230 associated therewith. FIG. 8 also illustrates one of the mounting blocks 142 that interact with the spacer 220 and locking assembly 230 to orient and secure the tray relative to the backplane 120 (shown in FIG. 3). The mounting block 142 includes a guide pin 242 extending therefrom. The guide pin 242 passes through the guide hole 144 (shown in FIG. 3) of the backplane 120 and passes into the spacer 220. The guide pin 242 is used to locate the tray 114 relative to the backplane 120 during assembly.

The locking assembly 230 includes a latch 232, an actuator 234 configured to actuate the latch 232, and a handle 236 configured to actuate the actuator 234. In an exemplary embodiment, the handle 236 is rotated to rotate the latch 232 between locked and unlocked positions. The handle 236 is provided along an exterior of the back wall 208. The handle 236 is accessible from the exterior of the tray 114. The handle 236 may be rotated by the installer without needing to access the front of the tray 114 or any of the other components such as the mounting block 142 or the spacer 220. The actuator 234 extends through the raceway of the frame 200 and drives rotation of the latch 232 between the locked and unlocked positions.

In an exemplary embodiment, the spacer 220 includes an opening 240 extending therethrough. The latch 232 is received in the opening 240. Optionally, the opening 240 may be cylindrical in shape and may allow rotation of the latch 232 within the opening 240. In an exemplary embodiment, the opening 240 receives the guide pin 242 to locate the spacer 220 relative to the mounting block 142. The latch 232 interacts with the guide pin 242 of the mounting block 142 to lockably couple the tray 114 to the backplane 120. Rotation of the latch 232 causes the latch 232 to move between locked and unlocked positions relative to the guide pin 242.

Figure 9:
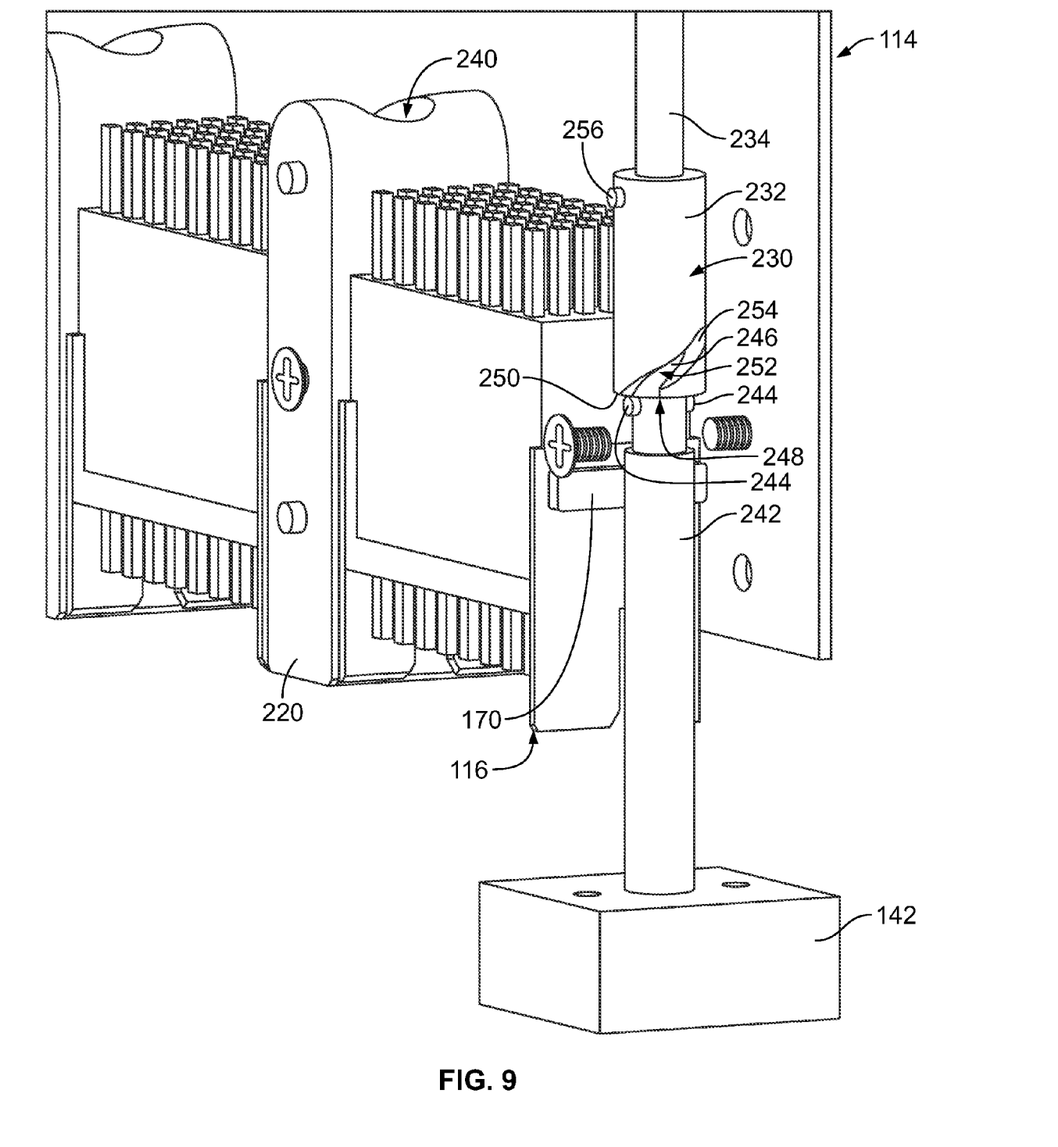
FIG. 9 illustrates a portion of the tray showing a portion of the locking assembly shown in FIG. 8.

FIG. 9 illustrates a portion of the tray 114 showing the latch 232 interacting with the guide pin 242. The spacer 220 has been removed to illustrate the interaction between the latch 232 and the guide pin 242.

The guide pin 242 includes pegs 244 extending from exterior sides of the guide pin 242. In the illustrated embodiment, the guide pin 242 includes two pegs 244 on opposite sides of the guide pin 242. Any number of pegs 244 may be provided on the guide pin 242. During assembly, an end 246 of the guide pin 242 is loaded into the spacer 220 and is received in the latch 232. In an exemplary embodiment, the latch 232 include a socket 248 that is hollow or open at a distal end 250 of the latch 232. The end 246 of the guide pin 242 is received in the socket 248 through the distal end 250.

The latch 232 includes grooves 252 configured to receive the corresponding pegs 244 of the guide pin 242. In an exemplary embodiment, the grooves 252 extend along helical paths around the socket 248. The grooves 252 may be open at an exterior of the latch 232. Each groove 252 has a ramp 254 that extends upward from the distal end 250. The peg 244 rides along the ramp 254 as the latch 232 is rotated to the locked position. Optionally, the groove 252 may have a notch or some other feature proximate to the end of the groove 252 that receives the peg 244 and holds the peg 244 in the groove 252. As the guide pin 242 is pulled into the socket 248, the tray 114 is pulled tight against the backplane 120 and mounting block 142. Optionally, the latch 232 may be rotated a quarter turn, or approximately 90°, between the locked and unlocked positions. As the latch 232 is rotated, the pegs 244 follow the grooves 252 to cinch down or pull together the tray 114 and the mounting block 142, thus securing the tray 114 to the backplane 120.

In an exemplary embodiment, the latch 232 includes a peg 256 that interacts with the spacer 220 to couple the latch 232 to the spacer 220. For example, the spacer 220 may have a groove or slot that receives the peg 256. As the latch 232 is rotated to the locked position, the peg 256 is received in the groove in the spacer 220 to secure the axial position of the latch 232 within the opening 240.

Each of the spacers 220 within the tray 114 are configured to hold a corresponding locking assembly 230. During assembly of the tray 114 to the backplane 120, all of the locking assemblies 230 are locked to securely couple the spacers 220 to the backplane 120. The guide pins 242 locate the spacers 220 in position relative to the backplane 120, and the locking assemblies 230 secure the spacers 220 to the mounting blocks 142. In an exemplary embodiment, even when the spacers 220 are fixed relative to the backplane 120, the cable connectors 116 are configured to float relative to the spacers 220 to change positions of the cables connectors 116 relative to the backplane 120. For example, the spacers 220 include pockets 222 (shown in FIG. 8) that receive the lugs 170 of the cable connectors. The pockets 222 are oversized relative to the lugs to allow movement of the cable connectors relative to the spacers 220.

Figure 10:
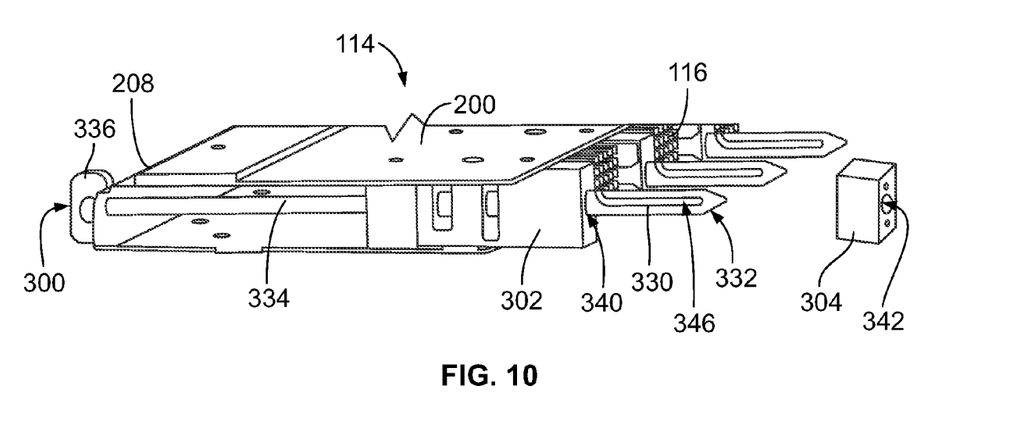
FIG. 10 is a partial sectional view of the tray showing a locking assembly formed in accordance with an exemplary embodiment.

FIG. 10 is a partial sectional view of the tray 114 with a portion of the frame 200 removed to illustrate a locking assembly 300 formed in accordance with an exemplary embodiment. Spacers 302 are held by the tray 114 to position and hold the cable connectors 116. Each spacer 302 has a corresponding locking assembly 300 associated therewith. FIG. 10 also illustrates a mounting block 304 that interacts with the spacer 302 and locking assembly 300 to orient and secure the tray 114 relative to the backplane 120 (shown in FIG. 3). The mounting block 304, spacer 302 and locking assembly 300 function in a similar way as the mounting block 142, spacer 220 and locking assembly 230 (all shown in FIG. 8) to position the tray 114 and lock or secure the tray 114 to the backplane 120 and mounting block 304, however the locking function is accomplished in a slightly different manner.

In the illustrated embodiment, the locking assembly 300 includes a latch 330 that is used to lockably couple the tray 114 to the corresponding mounting block 304. The latch 330 includes a guide pin 332 extending therefrom. The guide pin 332 passes through the guide hole 144 (shown in FIG. 3) of the backplane 120 and passes into the mounting block 304 to align the tray 114 with the mounting block 304, and thus the backplane 120. The guide pin 332 may extend through the mounting block 304 for alignment of the line card 102 or switch card 104 (both shown in FIG. 1) to the cable connectors 116.

The locking assembly 300 includes an actuator 334 configured to actuate the latch 330, and a handle 336 configured to actuate the actuator 334. The handle 336 is rotated to rotate the latch 330 between locked and unlocked positions. The handle 336 is provided along an exterior of the back wall 208. The handle 336 is accessible from the exterior of the tray 114. The handle 336 may be rotated by the installer without needing to access the front of the tray 114 or any of the other components such as the mounting block 304 or the spacer 302. The actuator 334 extends through the raceway of the frame 200 and drives rotation of the latch 330 between the locked and unlocked positions.

In an exemplary embodiment, the spacer 302 includes an opening 340 extending therethrough. The latch 330 is received in the opening 340. Optionally, the opening 340 may be cylindrical in shape and may allow rotation of the latch 330 within the opening 340. The latch 330 extends forward of the spacer 302 such that the latch 330 may be received in a socket 342 in the mounting block 304. The latch 330 interacts with the mounting block 304 to lockably couple the tray 114 to the backplane 120. The latch 330 engages pegs 344 (shown in FIG. 11) within the socket 342 to secure the latch 330 to the mounting block 304. For example, the latch 330 includes grooves 346 along the exterior surface of the guide pin 332 that receive the pegs 344. Rotation of the latch 330 causes the latch 330 to move between locked and unlocked positions relative to the mounting block 304.

Figure 11:
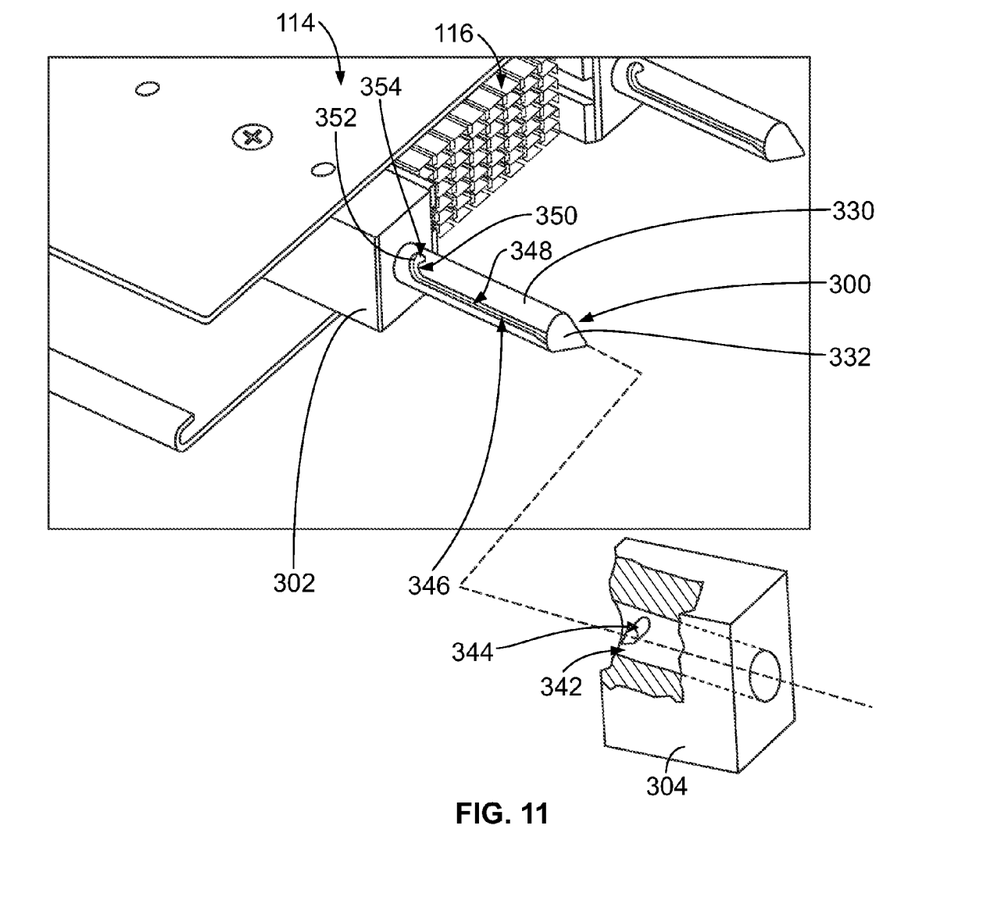
FIG. 11 is a front perspective view of a portion of the tray showing the locking assembly shown in FIG. 10.

FIG. 11 is a front perspective view of a portion of the tray 114 showing the latch 330 poised for loading into the socket 342 in the mounting block 304. A section of the mounting block 304 has been removed to illustrate the socket 342 and pegs 344.

The latch 330 includes the grooves 346 extending along the exterior sides of the guide pin 332. In the illustrated embodiment, the latch 330 includes two grooves 346 on opposite sides of the guide pin 332. Any number of grooves 346 may be provided on the guide pin 332. During assembly, the end of the guide pin 332 is loaded into the mounting block 304 such that the grooves 346 are aligned with and receive the pegs 344.

The grooves 346 have loading sections 348 that extend generally axially along a linear path along the guide pin 332 and locking sections 350 that are angled or curved with respect to the loading sections 348. The pegs 344 are received in the loading sections 348 and guided to the locking sections 350. When the latch 330 is rotated to the locked position, the pegs 344 are received in the locking sections 350 and the latch 330 is pulled into the mounting block 304. Optionally, the latch 330 may be rotated a quarter turn, or approximately 90°, between the locked and unlocked positions. As the latch 330 is pulled into the mounting block 304, the tray 114 is pulled tight against the backplane 120 and mounting block 304. Optionally, the spacer 302 may be pulled tight against the rear of the backplane 120. In an exemplary embodiment, the locking sections 350 each have a ramp 352 that leads to a notch 354. The peg 344 rides along the ramp 352 as the latch 330 is rotated to the locked position, which pulls the latch 330 into the socket 342 of the mounting block 304. In the locked position, the peg 344 rests in the notch 354 and the notch 354 prevents unintentional rotation of the latch 330 in an unlocking direction.

Each of the spacers 302 within the tray 114 are configured to hold a corresponding locking assembly 300. During assembly of the tray 114 to the backplane 120, all of the locking assemblies 300 are locked to securely couple the spacers 302 to the backplane 120. The guide pins 332 locate the spacers 302 in position relative to the backplane 120, and the locking assemblies 300 secure the spacers 302 to the mounting blocks 304. In an exemplary embodiment, even when the spacers 302 are fixed relative to the backplane 120, the cable connectors 116 are configured to float relative to the spacers 302 to change positions of the cables connectors 116 relative to the backplane 120.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
    a backplane having a plurality of openings therethrough, the backplane having mounting blocks proximate the openings; and
    a cable rack coupled to a rear of the backplane, the cable rack comprising:
    a tray having a frame with side walls surrounding a raceway, the side walls extending to a front edge of the frame;
    spacers coupled to the tray proximate to the front edge;
    cable connector assemblies held by corresponding spacers, each cable connector assembly having a plurality of cables extending between at least two cable connectors, the cables being routed in the raceway, the cable connectors being received in corresponding openings and held in position relative to the backplane by the spacers; and
    locking assemblies held by the tray, the locking assemblies each having a latch proximate to the front edge configured to interact with a corresponding one of the mounting blocks to lockably couple the tray to the backplane, the locking assemblies each having an actuator at a rear of the tray that is actuated by an installer to lock and unlock the latch with the mounting block.

2. The cable backplane system of claim 1, wherein the latch is rotated between locked and unlocked positions.

3. The cable backplane system of claim 1, wherein the latch passes at least partially through a corresponding one of the spacers.

4. The cable backplane system of claim 1, wherein the latch includes a groove, the mounting blocks each including a peg received in the corresponding groove.

5. The cable backplane system of claim 1, wherein each of the latches includes a guide pin extending forward of a corresponding one of the spacers and the front edge of the frame, the guide pin passing through the backplane into the corresponding mounting block, the guide pin being rotated to lock the guide pin in the corresponding mounting block.

6. The cable backplane system of claim 5, wherein the guide pin includes a groove along a side of the guide pin, the mounting block includes a socket that receives the guide pin and a peg extending into the socket, the peg being received in the groove to lock the guide pin in the mounting block.

7. The cable backplane system of claim 1, wherein each of the latches includes a socket received in a corresponding one of the spacers, the mounting block includes a guide pin, the guide pin being received in the corresponding spacer and in the socket, the socket being rotated to lock the guide pin in the socket.

8. The cable backplane system of claim 7, wherein the socket includes a groove along a side of the socket, the guide pin includes a peg extending therefrom, the peg being received in the groove to lock the guide pin in the socket.

9. The cable backplane system of claim 1, wherein each locking assembly includes a handle accessible at the rear of the tray, the handle being turned to actuate the actuator and lock or unlock the latch.

10. The cable backplane system of claim 1, wherein the locking assemblies fix the spacers in position relative to the backplane, the cable connectors being configured to float relative to the spacers to change positions of the cable connectors relative to the backplane.

11. A cable backplane system comprising:
a backplane having a plurality of openings therethrough, the backplane having mounting blocks proximate the openings; and
a cable rack coupled to a rear of the backplane, the cable rack comprising:
a tray having a frame with side walls surrounding a raceway, the side walls extending to a front edge of the frame;
spacers coupled to the tray proximate to the front edge;
cable connector assemblies held by corresponding spacers, each cable connector assembly having a plurality of cables extending between at least two cable connectors, the cables being routed in the raceway, the cable connectors being received in corresponding openings and held in position relative to the backplane by the spacers; and
locking assemblies held by the tray, the locking assemblies each having a latch proximate to the front edge configured to interact with a corresponding one of the mounting blocks to lockably couple the tray to the backplane, the latch includes a guide pin extending forward of a corresponding one of the spacers and the front edge of the frame, the guide pin passes through the backplane into the corresponding mounting block, the lock assemblies each have an actuator at a rear of the tray that is actuated by an installer to lock and unlock the latch with the mounting block.

12. The cable backplane system of claim 11, wherein the latch is rotated between locked and unlocked positions.

13. The cable backplane system of claim 11, wherein the latch passes at least partially through the corresponding spacer.

14. The cable backplane system of claim 11, wherein the guide pin includes a groove along a side of the guide pin, the mounting block includes a socket that receives the guide pin and a peg extending into the socket, the peg being received in the groove to lock the guide pin in the mounting block.

15. The cable backplane system of claim 11, wherein each locking assembly includes a handle accessible at the rear of the tray, the handle being turned to actuate the actuator and lock or unlock the latch.

16. A cable backplane system comprising:
a backplane having a plurality of openings therethrough, the backplane having mounting blocks proximate the openings, the mounting block including a guide pin extending through the backplane; and
a cable rack coupled to a rear of the backplane, the cable rack comprising:
a tray having a frame with side walls surrounding a raceway, the side walls extending to a front edge of the frame;
spacers coupled to the tray proximate to the front edge;
cable connector assemblies held by corresponding spacers, each cable connector assembly having a plurality of cables extending between at least two cable connectors, the cables being routed in the raceway, the cable connectors being received in corresponding openings and held in position relative to the backplane by the spacers; and
locking assemblies held by the tray, the locking assemblies each having a latch proximate to the front edge configured to interact with a corresponding one of the mounting blocks to lockably couple the tray to the backplane, the latch including a socket that receives the guide pin, the lock assemblies each having an actuator at a rear of the tray that is actuated by an installer to lock the guide pin in the socket.

17. The cable backplane system of claim 16, wherein the latch is rotated between locked and unlocked positions.

18. The cable backplane system of claim 16, wherein the latch passes at least partially through a corresponding one of the spacers.

19. The cable backplane system of claim 16, wherein the socket includes a groove along a side of the socket, the guide pin includes a peg extending therefrom, the peg being received in the groove to lock the guide pin in the socket.

20. The cable backplane system of claim 16, wherein each locking assembly includes a handle accessible at the rear of the tray, the handle being turned to actuate the actuator and lock or unlock the latch.

* * * * *